(12) United States Patent
Backsen et al.

(10) Patent No.: US 11,462,284 B2
(45) Date of Patent: Oct. 4, 2022

(54) METHOD AND SYSTEM FOR ANALYZING A REFRESH RATE OF A VOLATILE MEMORY DEVICE

(71) Applicant: Keysight Technologies, Inc., Santa Rosa, CA (US)

(72) Inventors: Michael Shaun Backsen, Westcliffe, CO (US); Frank D. Simon, Colorado Springs, CO (US); Jennie Colleen Grosslight, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1764 days.

(21) Appl. No.: 14/840,530

(22) Filed: Aug. 31, 2015

(65) Prior Publication Data

US 2017/0062073 A1      Mar. 2, 2017

(51) Int. Cl.
*G11C 29/02* (2006.01)
*G11C 11/406* (2006.01)

(52) U.S. Cl.
CPC ........ *G11C 29/02* (2013.01); *G11C 11/40615* (2013.01); *G11C 11/406* (2013.01); *G11C 29/023* (2013.01)

(58) Field of Classification Search
CPC . G11C 11/406; G11C 11/40615; G11C 29/02; G11C 29/023
USPC ....................................................... 702/186
See application file for complete search history.

(56) References Cited

U.S. PATENT DOCUMENTS

| | | | | |
|---|---|---|---|---|
| 10,599,504 | B1* | 3/2020 | BeSerra | G06F 11/3055 |
| 2003/0210595 | A1* | 11/2003 | Lee | G11C 11/406 |
| | | | | 365/201 |
| 2007/0047378 | A1* | 3/2007 | Wolford | G11C 7/1072 |
| | | | | 365/189.15 |
| 2013/0207641 | A1* | 8/2013 | Timm | G01R 13/0272 |
| | | | | 324/121 R |
| 2014/0016423 | A1* | 1/2014 | Ware | G11C 11/40615 |
| | | | | 365/222 |
| 2014/0153350 | A1* | 6/2014 | Boehm | G11C 11/40615 |
| | | | | 365/222 |
| 2014/0189229 | A1* | 7/2014 | Schoenborn | G11C 11/40611 |
| | | | | 711/106 |

OTHER PUBLICATIONS

Keysight Infiniium Oscilloscope (c) Keysight Technologies, 2014, Published in the USA, Aug. 4, 2014, 599-3958EN.*

* cited by examiner

*Primary Examiner* — Paul D Lee (57) ABSTRACT

A system and method are provided for a analyzing a refresh rate of a device under test (DUT) such as a volatile memory device that includes a memory and an associated memory controller. The method includes acquiring refresh data based upon signals between the memory and the memory controller of the volatile memory device over a time period, determining the refresh rate of the volatile memory device for time windows of the time period based upon the acquired refresh data, and displaying the refresh rate of the volatile memory device, compared to a refresh threshold, on a graphical user interface (GUI), for each of the time windows over the time period.

28 Claims, 4 Drawing Sheets

METHOD AND SYSTEM FOR ANALYZING A REFRESH RATE OF A VOLATILE MEMORY DEVICE

BACKGROUND

In volatile memories, the information stored in the memory may be lost unless it is "refreshed" periodically, for example, to keep the capacitor charge at adequate levels. Volatile memories include double data rate (DDR) volatile memory devices and low power DDR (LPDDR) volatile memory devices, for example. Specifications for different varieties of DDR/LPDDR memory provide information on what is required to keep the memory refreshed, and it may be important that the DDR/LPDDR bus implementation handles this correctly. If a memory is not refreshed correctly, corruption of stored data may result.

System failures may also result, but linking such failures to general memory corruption due to insufficient refresh may be difficult to do. Thus, being able to find refresh issues directly, rather than indirectly through random failures, may be desirable.

It is known that refresh requirements may be met by issuing refresh commands on the bus at regular intervals. However, there may be inherent limitations to such an approach. First, it is possible that vital code may be running that cannot get swapped out at the exact time that a refresh command is needed. Second, additional power consumption may be needed if a device that was in a low-power state (e.g. due to user inactivity) needed to be "woken up" simply to issue a refresh command to the memory.

For these and other similar reasons, there is typically flexibility built into the refresh requirements. This flexibility results in better operation of the memory device, but also results in more complication when it comes to evaluating whether or not refresh requirements have been satisfied, for example, during analysis of a device under test (DUT).

There are two general ways of refreshing memory. These approaches include the use of explicit refresh commands, and by putting the memory into "self refresh" mode. When the memory is in self-refresh mode, it is able to keep itself refreshed, but is not available for reading or writing. Thus, self-refresh mode is particularly useful when the device is in a power-down state for relatively long periods of time.

Although over-refreshing includes issuing more refresh commands than are needed to ensure memory integrity, this is not a catastrophic problem, but it wastes time and power, and results in poorer performance.

Thus, when analyzing a refresh rate of a DUT, users may benefit from easy-to-read displayed information that communicates whether refreshing of the memory is occurring at desirable levels.

SUMMARY

In accordance with a representative embodiment, a method is provided for a analyzing a refresh rate of a device under test (DUT) comprising a volatile memory device including a memory and an associated memory controller. The method includes acquiring refresh data based upon signals between the memory and the memory controller of the volatile memory device over a time period, determining the refresh rate of the volatile memory device for time windows of the time period based upon the acquired refresh data, and displaying the refresh rate of the volatile memory device, compared to a refresh threshold, on a graphical user interface (GUI), for each of the time windows over the time period.

In certain embodiments, the time period is selectable. Also, the refresh rate may be based upon refresh commands from the memory controller and a self refresh mode of the memory for the time windows over the time period. The refresh rate may be based upon a total number of refresh commands from the memory controller and a total amount of time spent in the self refresh mode for the time windows over the time period.

In certain embodiments, displaying includes displaying the total number of refresh commands from the memory controller relative to the total amount of time spent in the self refresh mode for the time windows over the time period. Displaying may include displaying the refresh rate of the volatile memory device for the time windows over the time period as a percentage of the refresh threshold. Displaying may include displaying the refresh rate of the volatile memory device for the time windows of the time period as a percentage of the refresh threshold.

In various embodiments, the refresh threshold comprises an under-refresh threshold and an over-refresh threshold.

Also, in certain embodiments, determining the refresh rate of the volatile memory device for time windows of the time period includes determining a controlled refresh rate change based upon an event within the acquired refresh data, and displaying further includes displaying the controlled refresh rate change on the GUI.

The volatile memory device may be a double data rate (DDR) volatile memory device or a low power DDR (LPDDR).

Another embodiment is directed to a test system for analyzing a refresh rate of a device under test (DUT) comprising a volatile memory device including a memory and an associated memory controller. The system includes a test data storage configured to receive and store refresh data based upon signals between the memory and the memory controller of the volatile memory device over a time period, and an analyzer configured to determine the refresh rate of the volatile memory device for time windows of the time period based upon the stored refresh data, and generate display data, including a refresh threshold and the determined refresh rate of the volatile memory device for each of the time windows over the time period, for display as a comparison on a graphical user interface (GUI).

In certain embodiments, the test system may include a user interface associated with the analyzer and test data storage for selection of the time period, a probe for acquiring the refresh data from signals between the memory and the memory controller of the volatile memory device over the time period, and a display device configured to display, via the GUI, the comparison of the refresh threshold and the determined refresh rate of the volatile memory device for each of the time windows over the time period.

The analyzer may be configured to determine the refresh rate based upon refresh commands from the memory controller and a self refresh mode of the memory for the time windows over the time period. The analyzer may be configured to determine the refresh rate based upon a total number of refresh commands from the memory controller and a total amount of time spent in the self refresh mode for the time windows over the time period.

In certain embodiments, a display device is coupled to the analyzer and configured to display, via the GUI, the total number of refresh commands from the memory controller relative to the total amount of time spent in the self refresh mode for the time windows over the time period. The display device may be coupled to the analyzer and configured to display, via the GUI, the refresh rate of the volatile memory device for the time windows over the time period as a percentage of the refresh threshold.

The refresh threshold may include an under-refresh threshold and an over-refresh threshold.

The analyzer may be configured to further determine a controlled refresh rate change based upon an event within the stored refresh data, and the display data may further include the controlled refresh rate change for display on the GUI.

Another embodiment is directed to a non-transitory computer-readable storage medium having stored therein machine readable instructions configured to be executed by a test system, the machine readable instructions being configured to cause the test system to execute a process for analyzing a refresh rate of a device under test (DUT) comprising a volatile memory device including a memory and an associated memory controller. The process includes acquiring refresh data based upon signals between the memory and the memory controller of the volatile memory device over a time period, determining the refresh rate of the volatile memory device for time windows of the time period based upon the acquired refresh data, and displaying the refresh rate of the volatile memory device, compared to a refresh threshold, on a graphical user interface (GUI), for each of the time windows over the time period.

The present embodiments provide methods, devices and systems that may provide insight into both whether a DUT is under-refreshing or is over-refreshing (e.g. a performance penalty). The use of an under-refresh threshold and an over-refresh threshold may provide a useful way to fine-tune the refresh rate of the DUT to allow for the best performance (e.g. reduced or no failures).

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

It will be understood that when an element is referred to as being "coupled to" another element, it can be directly coupled, or intervening elements may be present.

The term computer readable-storage medium also refers to various types of recording media configured to be accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly including multiple storage devices or components. For instance, the storage may include multiple storage devices within the same computer system or computing device. The storage may also include multiple storages distributed amongst multiple computer systems or computing devices.

A 'processor' as used herein encompasses an electronic component which is configured to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Initially, it is pointed out that to design, characterize, and troubleshoot devices and systems (e.g. communication devices and systems including volatile memories), engineers need to measure a variety of characteristics of the device signals. To make such measurements, engineers generally use a logic analyzer and associated probing system and display.

Figure 1:
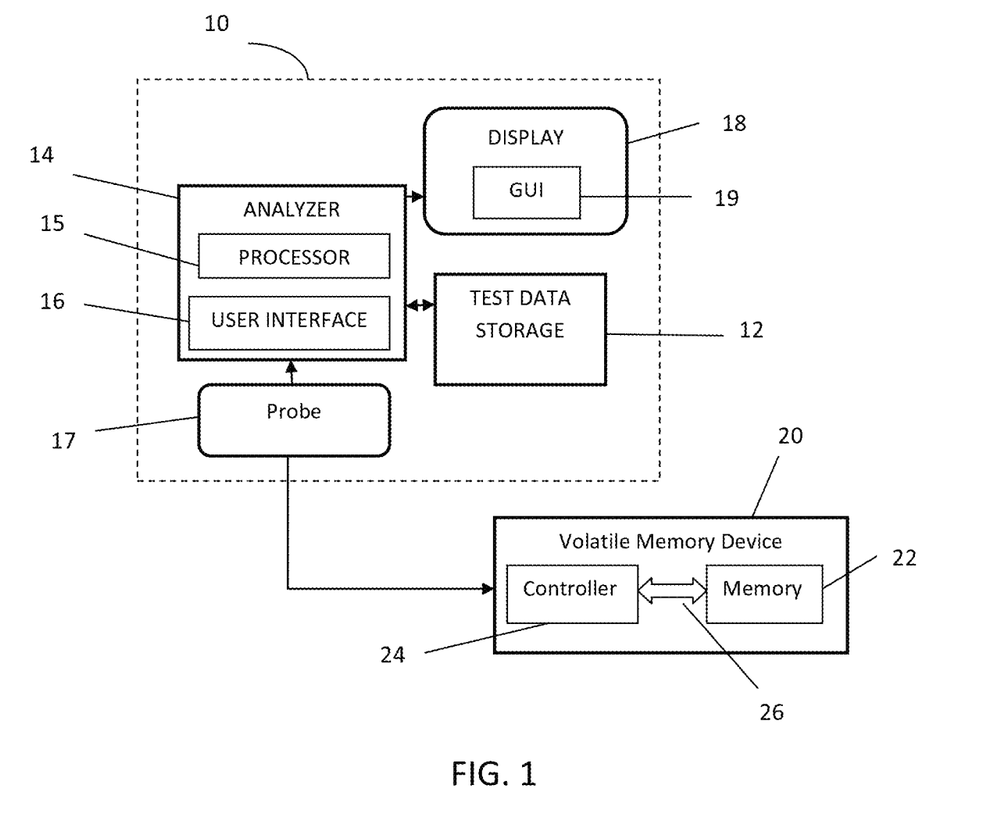
FIG. 1 is a schematic block diagram illustrating an embodiment of a test system for analyzing the refresh rate of a DUT in accordance with features of the present invention.

Referring initially to FIG. 1, a representative embodiment of a test system 10 for analyzing a refresh rate of a device under test (DUT) 20 will be described. In the description, the DUT 20 is a volatile memory device including a memory 22 and an associated memory controller 24 that communicate to each other over a bus 26. For example, the DUT 20 may be a double data rate (DDR) volatile memory device or a low power DDR (LPDDR). The present approach also applies to any other DUT that includes the use of a memory refresh.

Specifications for different varieties of DDR/LPDDR memory provide information on what is required to keep the memory refreshed, and it may be important that the DDR/LPDDR bus implementation handles this correctly. As discussed above, if a memory is not refreshed correctly, corruption of stored data may result.

The present approach provides the capability to find refresh issues directly through testing and analysis, rather than indirectly through random failures. Users may benefit from easy-to-read displayed information that communicates whether refreshing of the memory is occurring at desirable levels.

There are two general ways of refreshing memory 22 of the DUT 20. These approaches include the use of explicit refresh commands, and by putting the memory 22 into "self refresh" mode. When the memory 22 is in self-refresh mode, it is able to keep itself refreshed, but is not available for reading or writing. Thus, self-refresh mode is particularly useful when the DUT 20 is in a power-down state for relatively long periods of time.

The system 10 includes a test data storage 12 or memory configured to receive and store refresh data based upon signals between the memory 22 and the memory controller 24 of the DUT 20 over a time period. The refresh data may be captured at the clock speed of the DUT 20 (e.g. up to 2.4 GHz for an LPDDR) and stored in the test data storage 12 as a trace or buffer of acquired data. An analyzer 14 is configured to determine the refresh rate of the DUT 20 for time windows of the time period based upon the stored refresh data, and generate display data, including a refresh threshold and the determined refresh rate of the DUT 20 for each of the time windows over the time period, for display, e.g. on a display device 18, as a comparison via a graphical user interface (GUI) 19. Of course, the test data storage 12 may also be included in the analyzer 14.

The refresh threshold may include an under-refresh threshold and an over-refresh threshold.

In certain embodiments, the analyzer 14 of the test system 10 may include a processor 15 and a user interface 16 for selection of the time period and various other parameters and/or settings. A probe 17 is for acquiring the refresh data from signals between the memory 22 and the memory controller 24 of the DUT 20 over the time period. For example, the probe 17 may be coupled to the DUT 20 to access data being communicated over the bus 26. The display device 18 is configured to display, via the GUI 19, the comparison of the refresh threshold and the determined refresh rate of the DUT 20 for each of the time windows over the time period.

As may be appreciated by those skilled in the art, the analyzer 14 may be coupled to the display device 18 and probe 17 of the test system 10 via a hardware interface.

The analyzer 14 may be configured to determine the refresh rate based upon refresh commands from the memory controller 24 and a self refresh mode of the memory 22 for the time windows over the time period. The analyzer 14 may be configured to determine the refresh rate based upon a total number of refresh commands from the memory controller 24 and a total amount of time that the memory 22 is in the self refresh mode for the time windows over the time period.

In certain embodiments, the display device 18 is coupled to the analyzer 14 and configured to display, via the GUI 19, the total number of refresh commands from the memory controller 24 relative to the total amount of time that the memory 22 is in the self refresh mode for the time windows over the time period. The display device 18 may be coupled to the analyzer 14 and configured to display, via the GUI 19, the refresh rate of the DUT 20 for the time windows over the time period as a percentage of the refresh threshold.

The analyzer 14 may be configured to further determine a controlled refresh rate change based upon an event within the stored refresh data in the test data storage 12, and the display data may further include the controlled refresh rate change for display on the GUI 19 of the display device 18. For example, refresh rate requirements may change based upon temperature, and may require a higher or lower refresh rate. There also may be other conditions that trigger a refresh rate change. So the memory controller 24 may poll the memory 22 regarding any change in the refresh rate. The analyzer 14 sees an event (e.g. answer from memory 22 to memory controller 24) on the bus 26 regarding the changed refresh rate and therefore adjusts the chart on the GUI 19 of the display device 18.

Figure 2:
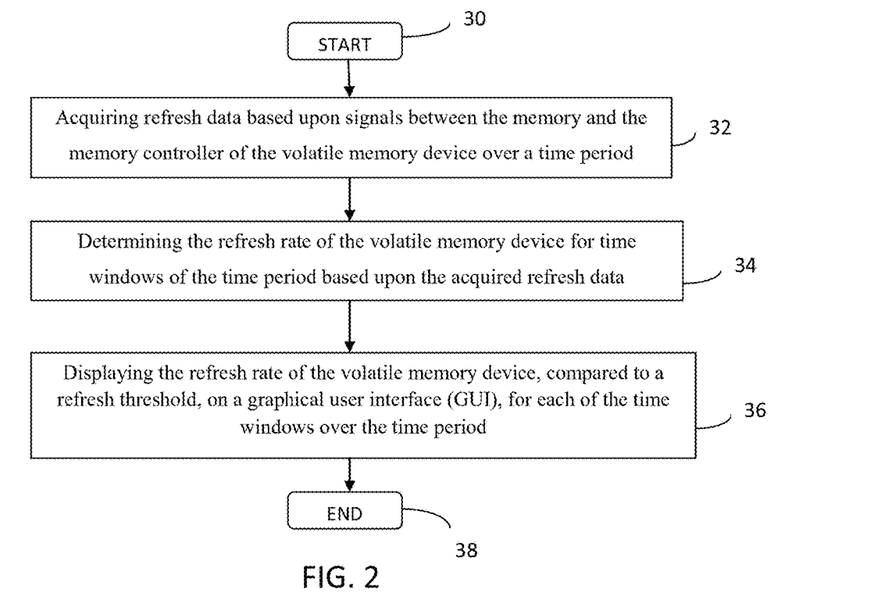
FIG. 2 is a flowchart illustrating the various steps of a method for analyzing a refresh rate of a DUT in accordance with features of a representative embodiment.

Referring additionally to FIG. 2, a method is provided for a analyzing a refresh rate of a DUT 20 such as a volatile memory device including the memory 22 and the associated memory controller 24. The method begins (block 30) and includes acquiring refresh data based upon signals between the memory and the memory controller of the volatile memory device over a time period at block 32. In certain embodiments, the time period is selectable, for example, via the user interface 16. The method includes determining the refresh rate of the volatile memory device for time windows of the time period based upon the acquired refresh data, at block 34, and displaying the refresh rate of the volatile memory device, compared to a refresh threshold, on a graphical user interface (GUI) 19, for each of the time windows over the time period, at block 36 before ending (block 38).

The refresh rate is preferably displayed as a chart on a display device 18 and will be discussed with reference to various examples of the GUI 19 as illustrated in FIGS. 3-7. Such a chart may provide advantages over other known approaches. For example, a user or operator can see an overview of refresh rate performance over the entire length of the trace, or zoom in to one particular area. A user can quickly jump to areas in the trace where under-refresh or over-refresh occurred. The GUI 19 may be customizable to allow the user to define the thresholds for under-refresh and over-refresh. When the approach is used with a qualified trace, the display information can provide insight on refresh performance for many minutes of system run time. The present approach may combine the compliance measurements with detailed performance charting, allowing the user to visually analyze both under-refresh and over-refresh simultaneously.

Figure 3:
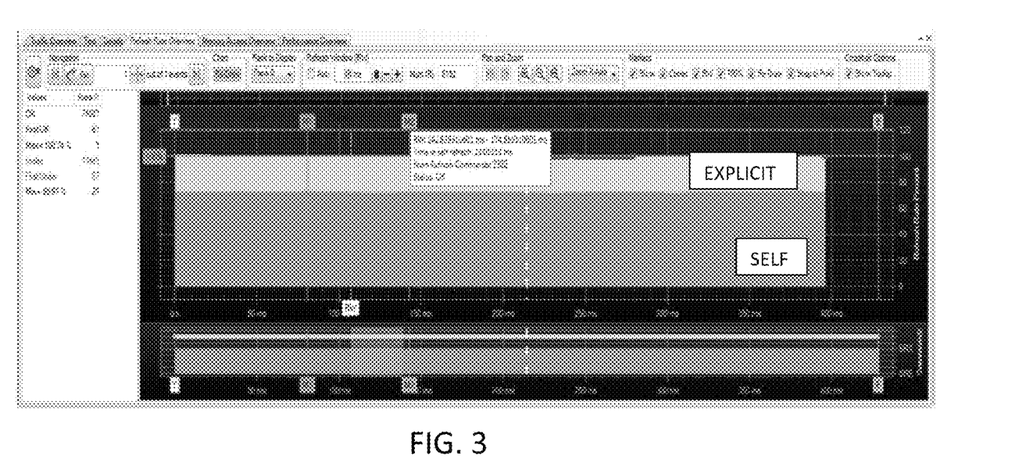
FIGS. 3-7 are examples of a graphical user interface showing the refresh rate compared to a refresh threshold on the display of the test system of FIG. 1.
Figure 4:
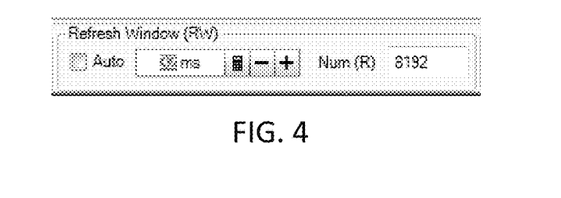

FIG. 3 illustrates a stacked (or "mountain") chart that shows the combined refresh rate of the time spent in self refresh mode (lower portion) and explicit refresh commands (upper portion). Known Specifications may require (e.g. in the case of LPDDR) or imply (in the case of other DDR varieties) that the refresh rate should be measured over relatively long periods of time, so at any given point in time, the value that is shown in the chart is actually the refresh rate for the time window that starts with the current time and continues until the end of the "refresh rate window", which is a length of time defined in the GUI 19, as shown in FIG. 4.

Figure 5:
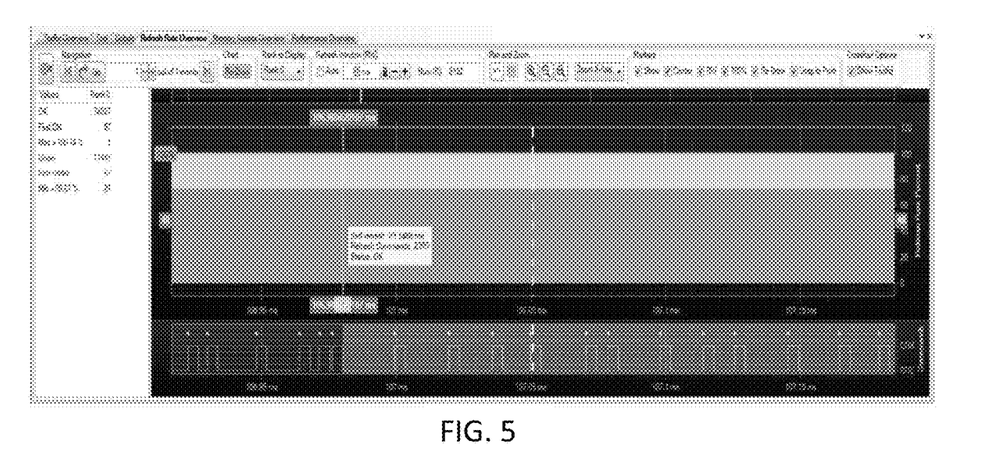
Figure 6:
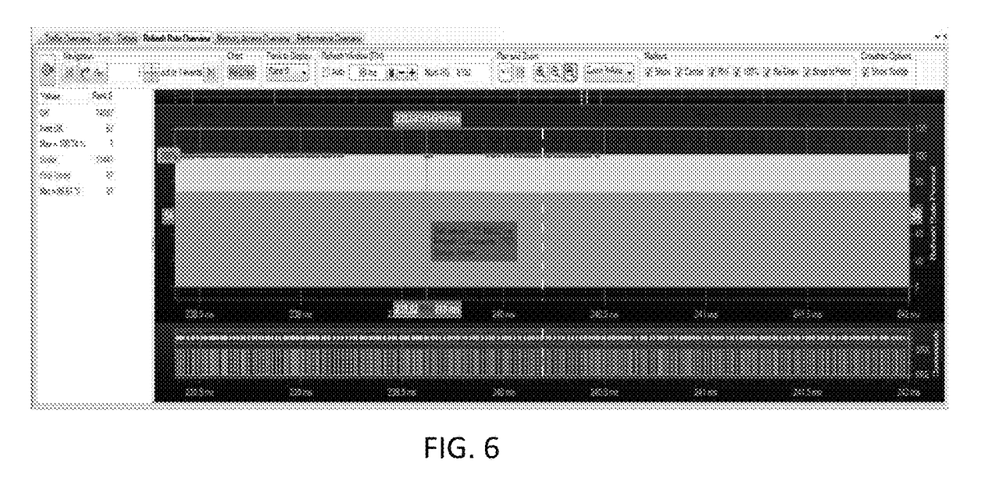

The smaller, bottom chart is a time chart (i.e. not a rolling window) that shows an indicator (e.g. a dot) for every refresh command, and a waveform that indicates if the DUT 20 is in self-refresh mode or not at that time. This bottom chart may be increasingly useful when the chart is more zoomed-in, as shown in FIGS. 5 and 6.

Figure 7:
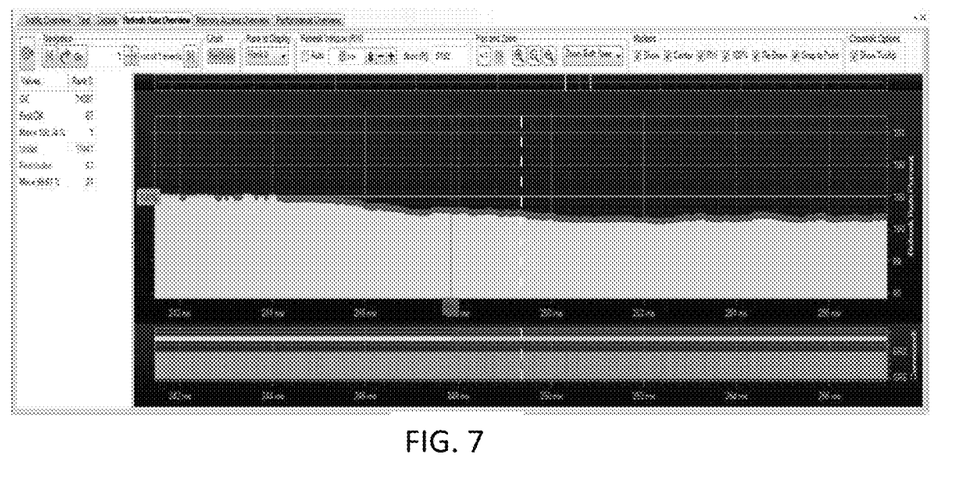

The example chart of FIG. 7 shows the y axis (e.g. the percentage of the desired refresh rate) being zoomed in, and, as can be seen in the chart, there is an extended period of time where the user is informed that the DUT 20 is under refreshing.

Data for a rolling window may be computed at every time t in the trace where there is a refresh-related event, i.e. a refresh command or a self-refresh entry or exit. When a point in the trace is reached where there is no longer enough information after t to do a full rolling window, i.e. where t+<refresh_rate_window_time> is greater than <end_of_trace_time>, then the chart stops. This, incidentally, explains why the top rolling window chart ends earlier than the bottom chart in FIG. 3. This chart is fully zoomed out, and the top chart ends when there is no longer enough time left in the trace to calculate a new rolling refresh window (e.g. 32 ms), while the bottom chart goes until the end of the trace.

The rolling refresh rate information in the upper, larger chart is useful to the user because it shows where the requirements for refresh rate are violated for any given time window. If this occurs, the bottom chart gives the user detailed information on why the refresh rate was violated. For example, did refresh commands suddenly stop occurring? Did a higher-priority process prevent one or more refresh commands from occurring when they should have? Did the system enter a power down state and not enable self refresh before entering that state?

The time window is selectable as shown in FIG. 4. The under-refresh and over-refresh thresholds can be selected or customized by a user. The default value for the under-refresh rate may come from the specification for the bus 26, but because the specifications can be very conservative on these numbers, a user might want to customize the value. And since over-refresh is not typically defined in the requirements at all (e.g. because the penalty for over-refresh is poorer performance), this value should be set by the user.

When the refresh rate dips below the under-refresh threshold, this represents an error. A feature may allow a user to quickly jump to a point where an under-refresh error occurs. Different analyzer display windows may be displayed together, which means that the user can quickly view the starting point of a refresh error in a waveform or listing window, in addition to in this chart.

Similarly, an over-refresh condition is a warning, and may be handled similarly, with the ability to quickly jump to the starting location of the condition. For example, when a mouse pointer hovers over an area in the display, a tooltip showing information on the refresh status at that time may be displayed.

Generally, the processor 15 of the analyzer 14, of the test system 10, may represent a control unit which can be implemented in numerous ways (e.g., such as with dedicated hardware) to perform various functions discussed herein. A processor is one example of the control unit or a component of the control unit, and may employ one or more microprocessors that may be programmed using software (e.g., microcode) to perform various functions discussed herein. The control unit may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, microcontrollers, application specific integrated circuits (ASICs), and field-programmable gate arrays (FPGAs).

The control unit may access a memory, such as test data storage 12, for instructions, as described in more detail below. The test data storage 12 may be associated with one or more computer-readable non-transitory storage media (generically referred to herein as "memory," e.g., volatile and non-volatile computer memory such as random-access memory (RAM), read-only memory (ROM), programmable read-only memory (PROM), electrically programmable read-only memory (EPROM), electrically erasable and programmable read only memory (EEPROM), universal serial bus (USB) drive, floppy disks, compact disks, optical disks, magnetic tape, etc.). In some implementations, the computer-readable non-transitory storage media may be encoded with one or more programs that, when executed on the control unit, perform at least some of the functions discussed herein. Various computer-readable non-transitory storage media may be fixed within the control unit, or may be transportable, such that the one or more programs stored thereon can be loaded into a processor or controller so as to implement various aspects of the present teachings discussed herein. The terms "program" or "computer program" are used herein in a generic sense to refer to any type of computer code (e.g., software or microcode) that can be employed to program the control unit.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems, for example, as discussed above.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method for analyzing a refresh rate of a device under test (DUT) comprising a volatile memory device including a memory and an associated memory controller, the method comprising:
    acquiring refresh data based upon signals between the memory and the associated memory controller of the volatile memory device over a time period;
    determining the refresh rate of the volatile memory device for time windows of the time period based upon the acquired refresh data, wherein determining the refresh rate of the volatile memory device for time windows of the time period comprises determining a controlled refresh rate change based upon an event regarding the changed controlled refresh rate within the acquired refresh data; and
    displaying the refresh rate of the volatile memory device, compared to a refresh threshold, on a graphical user interface (GUI), for each of the time windows over the time period.

2. The method of claim 1, wherein the time period is selectable.

3. The method of claim 1, wherein the refresh rate is based upon refresh commands from the associated memory controller and a self refresh mode of the memory for the time windows over the time period.

4. The method of claim 3, wherein the refresh rate is based upon a total number of refresh commands from the associated memory controller and a total amount of time spent in the self refresh mode for the time windows over the time period.

5. The method of claim 4, wherein displaying includes displaying the total number of refresh commands from the associated memory controller relative to the total amount of time spent in the self refresh mode for the time windows over the time period.

6. The method of claim 4, wherein displaying includes displaying the refresh rate of the volatile memory device for the time windows over the time period as a percentage of the refresh threshold.

7. The method of claim 1, wherein displaying includes displaying the refresh rate of the volatile memory device for the time windows of the time period as a percentage of the refresh threshold.

8. The method of claim 1, wherein the refresh threshold comprises an under-refresh threshold and an over-refresh threshold.

9. The method of claim 1, wherein displaying further includes displaying the controlled refresh rate change on the GUI.

10. The method of claim 1, wherein the volatile memory device comprises a double data rate (DDR) volatile memory device.

11. The method of claim 10, wherein the DDR volatile memory device comprises a low power DDR (LPDDR).

12. A test system for analyzing a refresh rate of a device under test (DUT) comprising a volatile memory device including a memory and an associated memory controller, the test system comprising:
    a test data storage configured to receive and store refresh data based upon signals between the memory and the associated memory controller of the volatile memory device over a time period; and
    an analyzer configured to determine the refresh rate of the volatile memory device for time windows of the time period based upon the stored refresh data, and to determine a controlled refresh rate change based upon an event within the stored refresh data, and generate display data, including a refresh threshold and the determined refresh rate of the volatile memory device for each of the time windows over the time period, for display as a comparison on a graphical user interface (GUI).

13. The test system of claim 12, further comprising:
    a user interface associated with the analyzer and test data storage for selection of the time period;

a probe for acquiring the refresh data from signals between the memory and the associated memory controller of the volatile memory device over the time period; and a display device configured to display, via the GUI, the comparison of the refresh threshold and the determined refresh rate of the volatile memory device for each of the time windows over the time period.

14. The test system of claim 12, wherein the analyzer is configured to determine the refresh rate based upon refresh commands from the associated memory controller and a self refresh mode of the memory for the time windows over the time period.

15. The test system of claim 14, wherein the analyzer is configured to determine the refresh rate based upon a total number of refresh commands from the associated memory controller and a total amount of time spent in the self refresh mode for the time windows over the time period.

16. The test system of claim 15, further comprising a display device coupled to the analyzer and configured to display, via the GUI, the total number of refresh commands from the associated memory controller relative to the total amount of time spent in the self refresh mode for the time windows over the time period.

17. The test system of claim 15, further comprising a display device coupled to the analyzer and configured to display, via the GUI, the refresh rate of the volatile memory device for the time windows over the time period as a percentage of the refresh threshold.

18. The test system of claim 12, wherein the refresh threshold comprises an under-refresh threshold and an over-refresh threshold.

19. The test system of claim 12, wherein the display data further includes the controlled refresh rate change for display on the GUI.

20. The test system of claim 12, wherein the volatile memory device comprises one of a double data rate (DDR) volatile memory device and a low power DDR (LPDDR).

21. A non-transitory computer-readable storage medium having stored therein machine readable instructions configured to be executed by a test system, the machine readable instructions being configured to cause the test system to execute a process for analyzing a refresh rate of a device under test (DUT) comprising a volatile memory device including a memory and an associated memory controller, the process comprising:

storing refresh data based upon signals between the memory and the associated memory controller of the volatile memory device over a time period;

determining the refresh rate of the volatile memory device for time windows of the time period based upon stored refresh data, wherein the determining the refresh rate of the volatile memory device for time windows of the time period comprises determining a controlled refresh rate change based upon an event within the stored refresh data; and displaying the refresh rate of the volatile memory device, compared to a refresh threshold, on a graphical user interface (GUI), for each of the time windows over the time period.

22. The non-transitory computer-readable storage medium of claim 21, wherein the refresh rate is based upon refresh commands from the associated memory controller and a self refresh mode of the memory for the time windows over the time period.

23. The non-transitory computer-readable storage medium of claim 22, wherein the refresh rate is based upon a total number of refresh commands from the associated memory controller and a total amount of time spent in the self refresh mode for the time windows over the time period.

24. The non-transitory computer-readable storage medium of claim 23, wherein displaying includes displaying the total number of refresh commands from the associated memory controller relative to the total amount of time spent in the self refresh mode for the time windows over the time period.

25. The non-transitory computer-readable storage medium of claim 23, wherein displaying includes displaying the refresh rate of the volatile memory device for the time windows over the time period as a percentage of the refresh threshold.

26. The non-transitory computer-readable storage medium of claim 21, wherein the refresh threshold comprises an under-refresh threshold and an over-refresh threshold.

27. The non-transitory computer-readable storage medium of claim 21, wherein displaying further includes displaying the controlled refresh rate change on the GUI.

28. The non-transitory computer-readable storage medium of claim 21, wherein the volatile memory device comprises one of a double data rate (DDR) volatile memory device and a low power DDR (LPDDR).

* * * * *